United States Patent
Kim

(10) Patent No.: US 6,930,448 B2
(45) Date of Patent: Aug. 16, 2005

(54) ORGANIC ELECTROLUMINESCENCE DISPLAY PANEL AND FABRICATION METHOD THEREOF

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/223,619

(22) Filed: Aug. 20, 2002

(65) Prior Publication Data

US 2003/0038591 A1 Feb. 27, 2003

(30) Foreign Application Priority Data

Aug. 21, 2001 (KR) ...................... P2001-50324

(51) Int. Cl.[7] .................................................. H01J 1/62
(52) U.S. Cl. ...................... 313/506; 313/500
(58) Field of Search ................. 313/504–506, 313/498–512

(56) References Cited

U.S. PATENT DOCUMENTS

| | | | | |
|---|---|---|---|---|
| 6,140,765 A | * | 10/2000 | Kim et al. | 313/506 |
| 6,157,127 A | * | 12/2000 | Hosokawa et al. | 313/506 |
| 2002/0014837 A1 | * | 2/2002 | Kim et al. | 313/505 |
| 2002/0167269 A1 | * | 11/2002 | Sugimoto et al. | 313/504 |

FOREIGN PATENT DOCUMENTS

| | | | | |
|---|---|---|---|---|
| CN | 1345526 A | * | 4/2002 | |
| JP | 2001223087 | * | 8/2001 | |

* cited by examiner

*Primary Examiner*—Joseph Williams
*Assistant Examiner*—German Colón
(74) *Attorney, Agent, or Firm*—Fleshner & Kim, LLP

(57) ABSTRACT

Disclosed are an organic EL(electroluminescence) display panel and a fabrication method thereof. The auxiliary electrode is formed to alternate but be overlapped with the pattern of the first electrode with a predetermined area so as to increase the pixel area as much as the overlapped area. Therefore, the present invention improves an opening ratio of the organic EL device. And, the present invention requires no additional step of forming an insulating layer for increasing an opening ratio, thereby saving a product cost for the fabrication of the organic EL device as well as being advantageous in fabrication efficiency. The present invention includes a transparent substrate, a first electrode formed on the transparent substrate, an auxiliary electrode overlapped with the first electrode in part so as to be connected to the first electrode, an organic light-emitting layer formed on the first electrode at the pixel, and a second electrode formed on the organic light-emitting layer so as to cross with the first electrode.

20 Claims, 12 Drawing Sheets

ORGANIC ELECTROLUMINESCENCE DISPLAY PANEL AND FABRICATION METHOD THEREOF

This application claims the benefit of the Korean Application No. P2001-50324 filed on Aug. 21, 2001, which is hereby incorporated by reference.

BACKGROUND OF THE INVENTION

1. Field of the Invention

The present invention relates to a display device, and more particularly, to an organic EL(electroluminescence) display panel and fabrication method thereof.

2. Discussion of the Related Art

Generally, as a size of a display device increases greatly, a flat panel type display panel occupying a small space attracts an attention.

Specifically, many efforts are made to study of fabricating a flat display panel using organic electroluminescent materials.

Organic EL display panels are divided into a passive matrix type panel and an active matrix type panel in accordance with driving methods.

In the passive matrix type display panel, scan electrode lines and data lines are arranged in rows/columns and pixels are formed at intersections between the rows and columns, respectively.

FIG. 1 illustrates a layout of a passive matrix type organic EL display panel according to a related art.

Referring to FIG. 1, an organic EL display panel includes pixels formed at intersections between scan and data electrodes crossing with each other like a matrix form.

And, the organic EL display panel further includes scan and data drivers applying currents to the scan and data electrodes, respectively so as to make the pixels emit light, respectively wherein the pixels are formed at the intersections between the scan and data electrodes crossing with each other.

A process of fabricating the organic EL display panel includes the steps of preparing a transparent substrate, forming a transparent electrode as a first electrode(anode) on the transparent substrate, forming an organic layer on the first electrode, forming a second electrode(cathode) on the organic layer using a metal compound, and forming a protecting layer on the second electrode.

The transparent substrate is formed of a glass material. As the transparent substrate fails to have electro-conductivity, ITO(indium tin oxide) is coated on the transparent substrate so as to form the transparent electrode.

Yet, ITO having great resistance is used after an auxiliary metal electrode has been formed.

Subsequently, barrier ribs are formed thereon, and then an organic material is deposited on an entire surface of the organic EL display panel so as to form an organic layer.

A scan electrode is then formed using a metal, thereby completing the fabrication process of the organic EL display panel.

In the constitution of the passive matrix type organic EL display panel, the number of pixels increases as the panel has higher resolution. Hence, the number of the scan and data electrode lines required for the more pixels increases as well.

If the number of the respective electrode lines increases, a time for one pixel to emit light is reduced in inverse proportion to the increase of the number.

Since the luminescent time for unit time of each pixel is reduced in inverse proportion to the increase of the number of the respective electrodes, instant brightness should become higher in order to overcome such a problem.

There are two kinds of general methods for complementing such a problem, which are shown in FIG. 2 and FIG. 3.

FIG. 2 and FIG. 3 illustrate layouts of complemented passive matrix type organic EL display panels according to a related art.

Specifically, FIG. 2 illustrates a structure of an organic EL display panel of which first electrode strip(anode strip) is divided into halves.

Referring to FIG. 2, a single electrode strip is divided into two strips. Each of the two strips performs an independent scan driving.

Thus, the number of scan for each strip is reduced half so as to improve a light-emitting efficiency and a device life time.

Yet, in the structure of the organic EL display panel, a data electrode is divided into both parties so as to need data drivers, which apply currents to the data electrodes, to be installed at both of the strips, respectively. Hence, product cost increases.

FIG. 3 illustrates a layout of an organic EL display panel of which first electrode strip(anode strip) is divided in a row direction.

Referring to FIG. 3, a width of a first electrode strip is reduced to a half of a conventional width, and an interval between scan electrodes is increased twice wider than a conventional one. Hence, the number of scan is reduced to half.

Even if the number of scan is reduced to half, the organic EL display panel shown in FIG. 3 requires no additional data driver applying a current to the data electrode. Yet, such a structure divides the width of the first electrode line into halves instead of a length direction, whereby an opening ratio is considerably reduced.

In order to overcome such a disadvantage, the opening ratio can be increased by using an insulating layer once more for an auxiliary electrode in the structure of the organic EL display panel. Yet, this method needs an additional step of forming the insulating layer, thereby increasing a product cost of the organic EL display panel fabrication as well as reducing a fabrication efficiency.

SUMMARY OF THE INVENTION

Accordingly, the present invention is directed to an organic EL(electroluminescence) display panel and fabrication method thereof that substantially obviates one or more problems due to limitations and disadvantages of the related art.

An object of the present invention is to provide an organic EL(electroluminescence) display panel and fabrication method thereof enabling to increase an opening ratio determining a brightness of a screen without an additional process.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in a double-scan-structured organic EL device having a plurality of pixels formed at intersections between electrodes crossing with each other, an organic EL display panel according to the present invention includes a transparent substrate, a first electrode formed on the transparent substrate, an auxiliary electrode overlapped with the first electrode in part so as to be connected to the first electrode, an organic light-emitting layer formed on the first electrode at the pixel, and a second electrode formed on the organic light-emitting layer so as to cross with the first electrode.

Preferably, the first electrode has a prominence-depression-like connecting portion between the pixels constructing a pair so as to connect the pixels constructing the pair in two pixel arrays arranged as column pairs to each other, and the first electrode is formed on each of the pixels so as to scan-drive simultaneously the pixels constructing the pair in the two pixel arrays arranged as the column pairs.

More preferably, the auxiliary electrode is formed on the first electrode having the prominence-depression-like connecting portion between the pixels.

Preferably, the first electrode is formed on each of the pixels so as to scan-drive simultaneously the pixels constructing a pair in two pixel arrays arranged as column pairs and wherein the first electrode is formed with two lines every one pixel array so as to connect the corresponding pixel thereto.

More preferably, a transparent conductive material is patterned to form the first electrode with two lines.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Prior to the explanation of the present invention, a first electrode indicates an anode or a data electrode and a second electrode indicates a cathode or a scan electrode.

And, an organic EL display panel has a double-scan structure as well as a passive matrix type having basically a plurality of pixels formed at intersections between first and second electrodes.

Specifically, the first electrode is formed on a transparent substrate, and an auxiliary electrode formed over the transparent substrate is formed to be overlapped with the first electrode in part. An organic light-emitting layer is formed on the first electrode, and the second electrode is formed on the organic light-emitting layer so as to cross with the first electrode.

An organic EL display panel and fabricating method thereof according to the present invention is explained in detail as follows.

Figure 1:
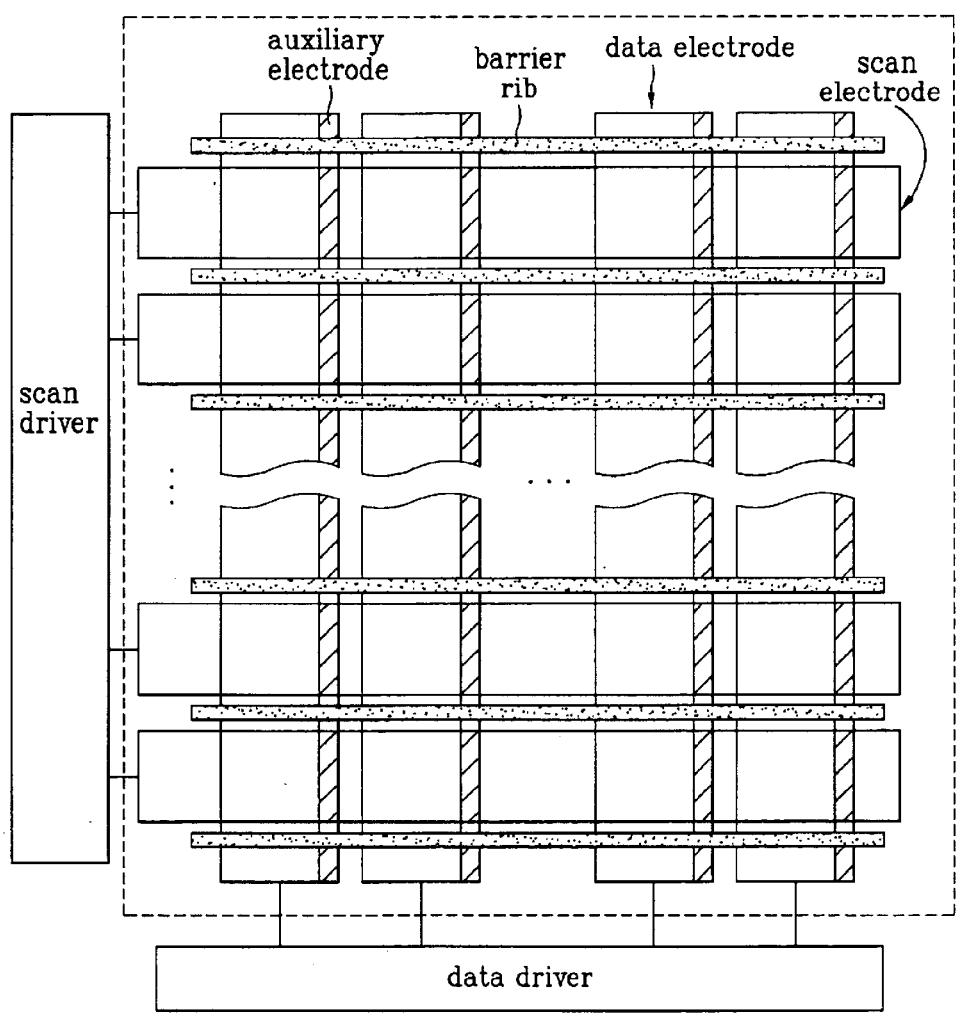
FIG. 1 illustrates a layout of a passive matrix type organic EL display panel according to a related art.
Figure 2:
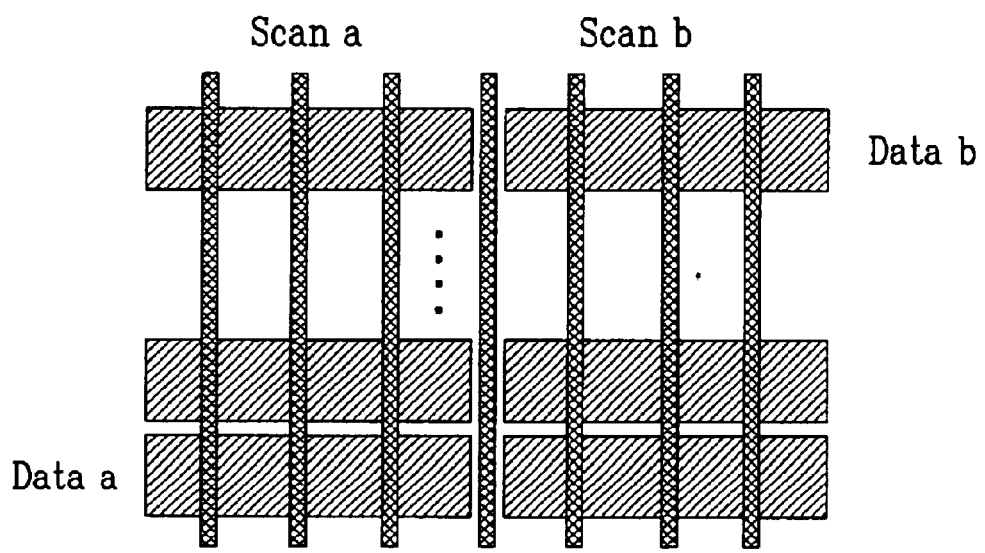
FIG. 2 illustrates a layout of complemented passive matrix type organic EL display panels according to a related art.
Figure 3:
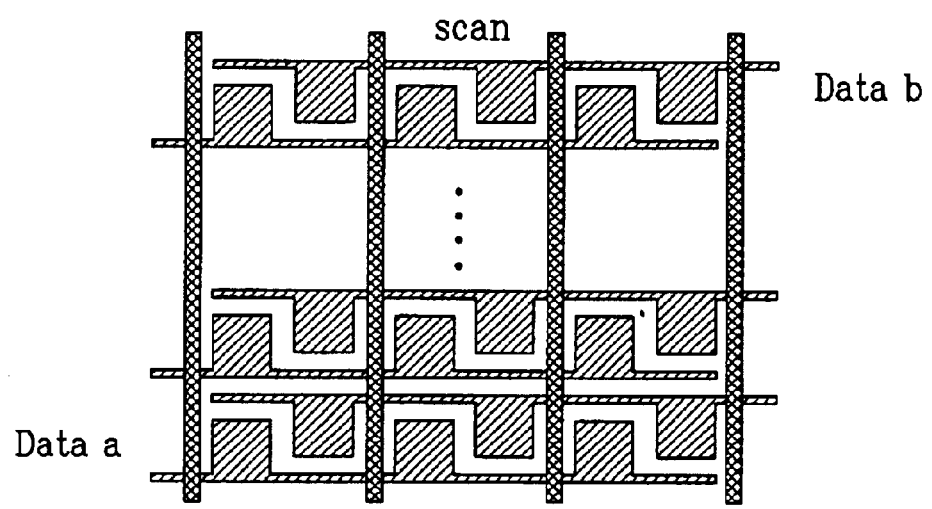
FIG. 3 illustrates another layout of complemented passive matrix type organic EL display panels according to a related art.
Figure 4:
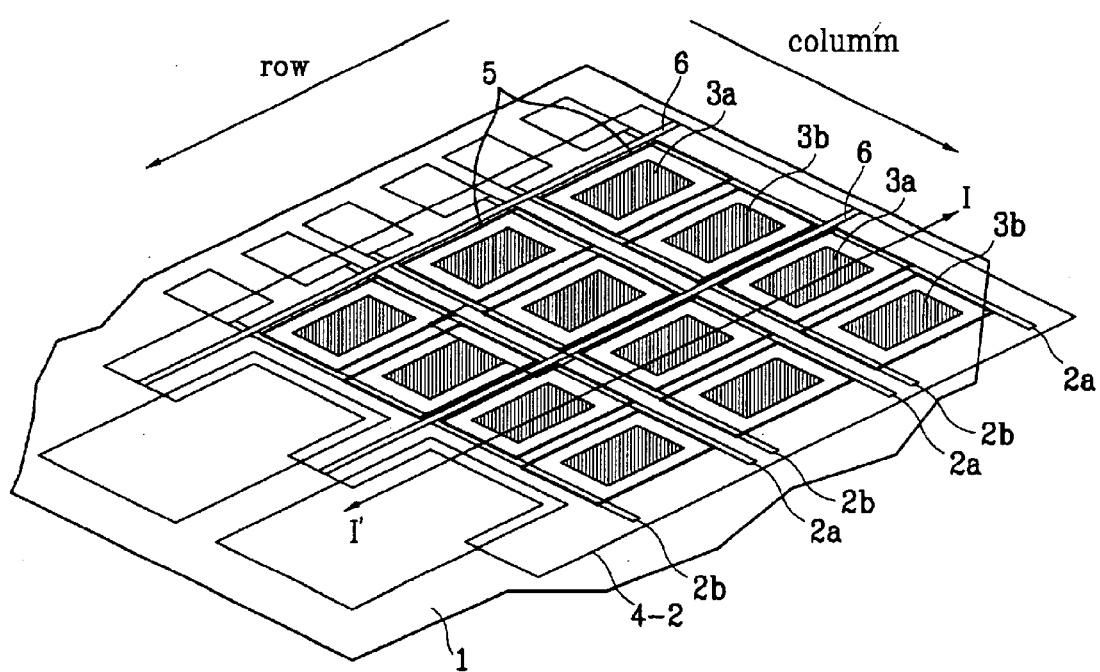
FIG. 4 illustrates a layout of a double-scan type organic EL display panel according to a first embodiment of the present invention.
Figure 5A:
FIGS. 5A to 5C illustrate cross-sectional views of a fabricating process along a cutting line I—I' in FIG. 4.
Figure 5B:
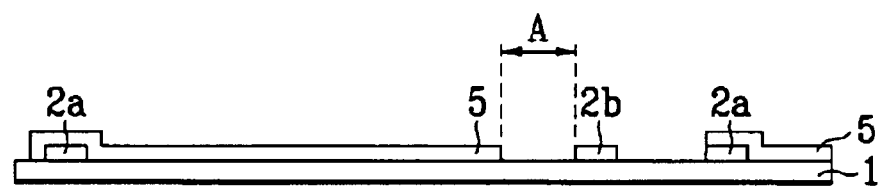
Figure 5C:
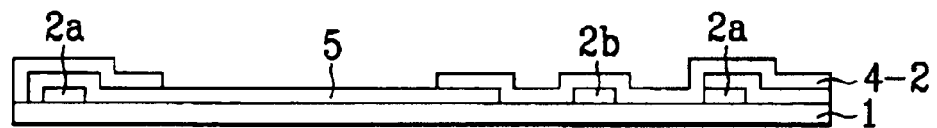

FIG. 4 illustrates a layout of a double-scan type organic EL display panel according to a first embodiment of the present invention, and FIGS. 5A to 5C illustrate cross-sectional views of a fabricating process along a cutting line I—I' in FIG. 4.

Referring to FIG. 4, a double-scan type organic EL display panel according to a first embodiment of the present invention includes a plurality of pixels at intersections between first electrodes 5 and second electrodes(not shown in the drawing), respectively.

The pixels form a single pixel array in a row direction in parallel with the first electrodes 5. And, a plurality of pixel arrays are arranged so as to form pairs in a column.

Specifically, two pixel arrays forming a column pair are scan-driven simultaneously. Namely, when one pixel array arranged in one direction is taken as a reference, an odd pixel(on pixel of the reference pixel array) 3a and an even pixel(a pixel forming the pair with an odd pixel in the pixel array forming a pair with the pixel array) 3b in a column direction are simultaneously scan-driven.

In the organic EL display panel, there are two pixel arrays running in one direction on a transparent substrate 1 so as to form two lines. As mentioned in the above description, one pixel array is arranged in one direction and the other pixel array is arranged in parallel with the one pixel array. Hence, two lines are arranged so as to form a pair.

Auxiliary electrodes 2a and 2b are formed in a direction vertical to the arranged pixel array. Two lines of the auxiliary electrodes 2a and 2b are formed for the respective pixels in the pixel array. Yet, one pixel is connected to one of the two lines of the auxiliary electrodes 2a and 2b.

For instance, an odd pixel 3a is connected to the auxiliary electrode 2a in a column direction and an even pixel 3b (forming a pair with the odd pixel 3a) is connected to the other auxiliary electrode 2b.

The first pixel electrode 5 formed in a row is patterned on the odd and even pixels 3a and 3b as well as connected to the auxiliary electrodes 2a and 2b.

An organic light-emitting layer(not shown in the drawing) is formed on the first electrode 5, and the second electrode (not shown in the drawing) is formed on the organic light-emitting layer.

An insulating layer 4-2 is formed over the transparent substrate 1 so as to cover an edge of the first electrode 5.

Barrier ribs 6 are formed at the respective pixel arrays arranged in one direction, and isolate the second electrode (not shown in the drawing) electrically by taking a pair of pixel arrays as a unit so as to scan-drive two pixel arrays forming a pair simultaneously.

A method of fabricating the organic EL display panel shown in FIG. 4 is explained by referring to FIGS. 5A to 5C as follows.

Referring to FIG. 5A, a pair of auxiliary electrodes 2a and 2b forming one set with two lines are formed on a transparent substrate 1. The auxiliary electrodes 2a and 2b are formed in a column direction vertical to a pixel array arranged in a row direction so as to correspond to each pixel of the pixel array.

An odd pixel 3a in a column direction is connected one auxiliary electrode 2a and an even pixel 3b forming a pair with the odd pixel 3a is connected to the other auxiliary electrode 2b.

Referring to FIG. 5B, a first electrode 5 is formed on a pixel to be electrically connected to the auxiliary electrodes 2a and 2b. In this case, the first electrode 5 is formed to leave a predetermined interval A from the auxiliary electrode so as not to be connected to a specific cell but isolated electrically from an adjacent auxiliary electrode. For instance, in aspect of a cross-sectional view of an odd pixel array, as shown in FIG. 5B, the first electrode 5 is formed to leave the interval "A" so as to be electrically isolated from the other auxiliary electrode 2b instead of the auxiliary electrode 2a connected to the odd pixel 3a.

Referring to FIG. 5C, an insulating layer 4-2 is formed on the transparent substrate 1 so as to cover an edge of the first electrode 5.

Thereafter, in the present invention, a barrier rib 6 is formed at each pixel array pair so that the pixel array pair arranged over the transparent substrate 1 in two lines constructing a pair in one direction is connected to an external scan electrode (second electrode) to be scan-driven simultaneously. Namely, one barrier rib 6 is formed every two pixel arrays. Hence, a second electrode that will be formed later is electrically separated by two pixel array unit.

After the barrier ribs 6 have been formed, an organic light-emitting layer (not shown in the drawing) is formed on the first electrode.

Finally, after a second electrode (not shown in the drawing) has been formed thereon, passivation for forming a protecting layer and encapsulation are carried out so as to complete a device.

In this case, the second electrode (not shown in the drawing) is connected to every two pixel arrays (pixel array pair) adjacent to each other on a direction crossing with the auxiliary electrodes 2a and 2b so as to scan-drive the two pixel arrays constructing one pair.

Figure 6:
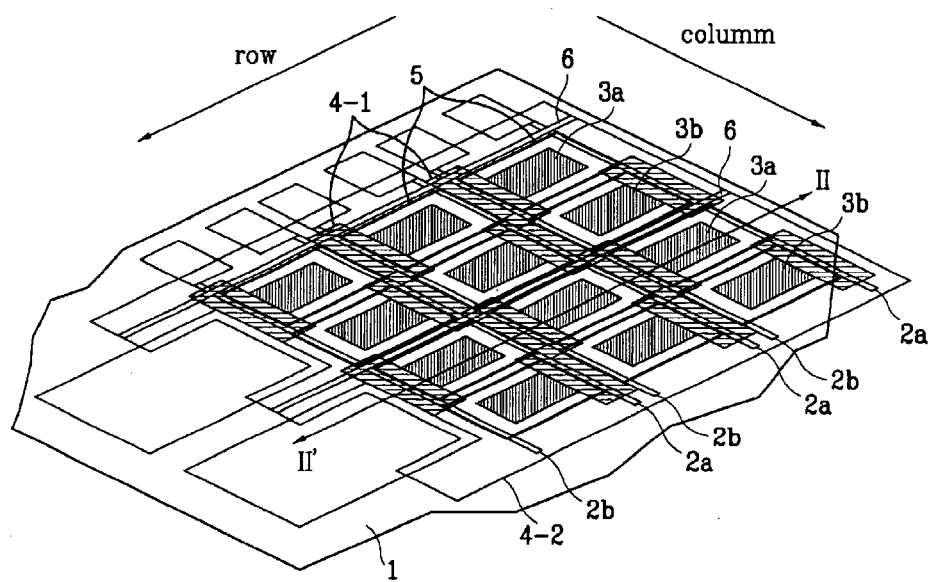
FIG. 6 illustrates a layout of a double-scan type organic EL display panel according to a second embodiment of the present invention.
Figure 7A:
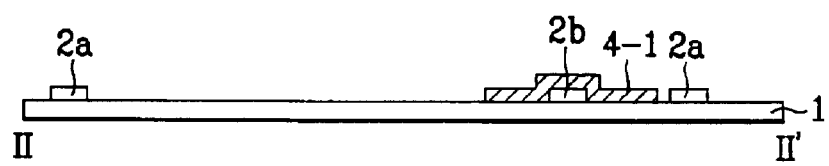
FIGS. 7A to 7C illustrate cross-sectional views of a fabricating process along a cutting line II—II' in FIG. 6.
Figure 7B:
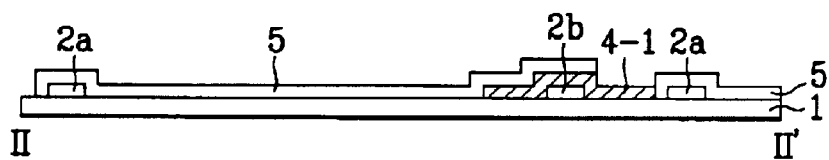
Figure 7C:
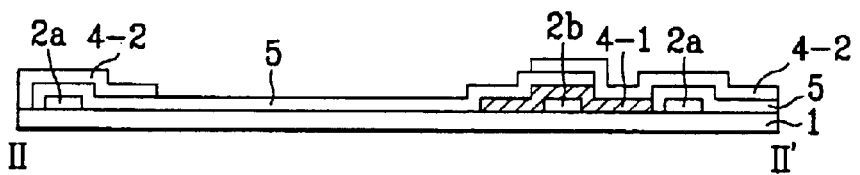

FIG. 6 illustrates a layout of a double-scan type organic EL display panel according to a second embodiment of the present invention, and FIGS. 7A to 7C illustrate cross-sectional views of a fabricating process along a cutting line II—II' in FIG. 6.

Referring to FIG. 6, an organic EL display panel according to a second embodiment of the present invention includes the same constitution of that shown in FIG. 4 but differs in that an insulating layer 4-1 is formed on a random one 2a or 2b of auxiliary electrodes 2a and 2b so that the auxiliary electrodes 2a and 2b forming two lines control each odd pixel 3a and each even pixel 3b in a column direction.

More specifically, referring to FIGS. 7A to 7C, in aspect of cross-sectional views of odd and even pixel arrays, the insulating layer 4-1 is formed on the auxiliary electrode 2b instead of the other auxiliary electrode 2a connected to the odd pixel 3a.

Hence, even if a first electrode 5 is formed to leave a predetermined interval from the insulating layer 4-1, the first electrode 5 is formed to be overlapped with the insulating layer 4-1 in part, or the first electrode 5, as shown in FIG. 7C, is entirely overlapped with the insulating layer 4-1, the insulating layer 4-1 isolates the first electrode 5 and auxiliary electrode 2b from each other.

Thus, the first electrode 5 need not be formed to leave the interval A from the auxiliary electrode 2b in order to be electrically isolated from the auxiliary electrode 2b failing to be connected to a specific pixel as well as being adjacent to the specific pixel only.

Therefore, it is able to expand an area where the first electrode 5 is formed so as to increase an opening ratio of a pixel.

Figure 8A:
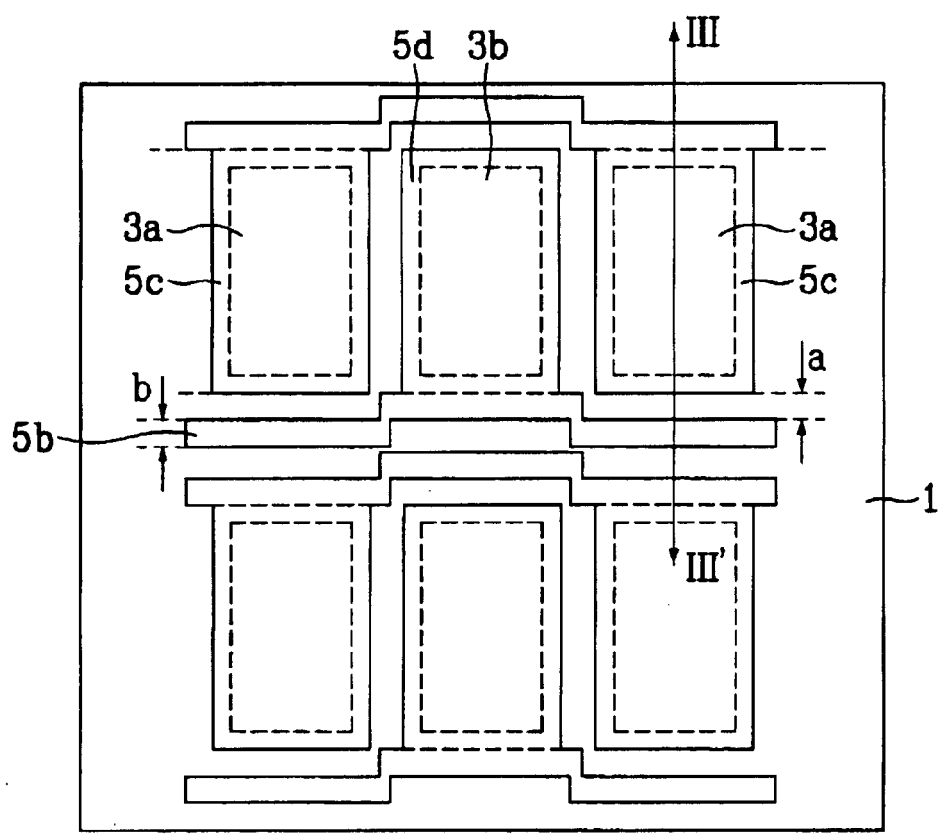
FIGS. 8A to 8C illustrate layouts of a fabricating process of a double-scan type organic EL display panel according to another embodiment of the present invention.
Figure 8B:
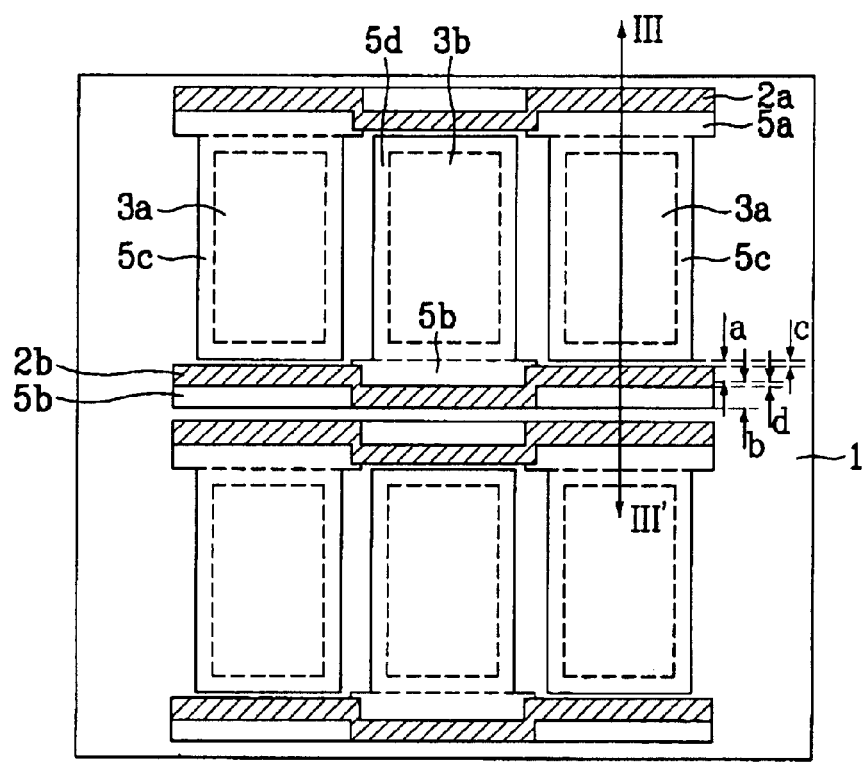
Figure 8C:
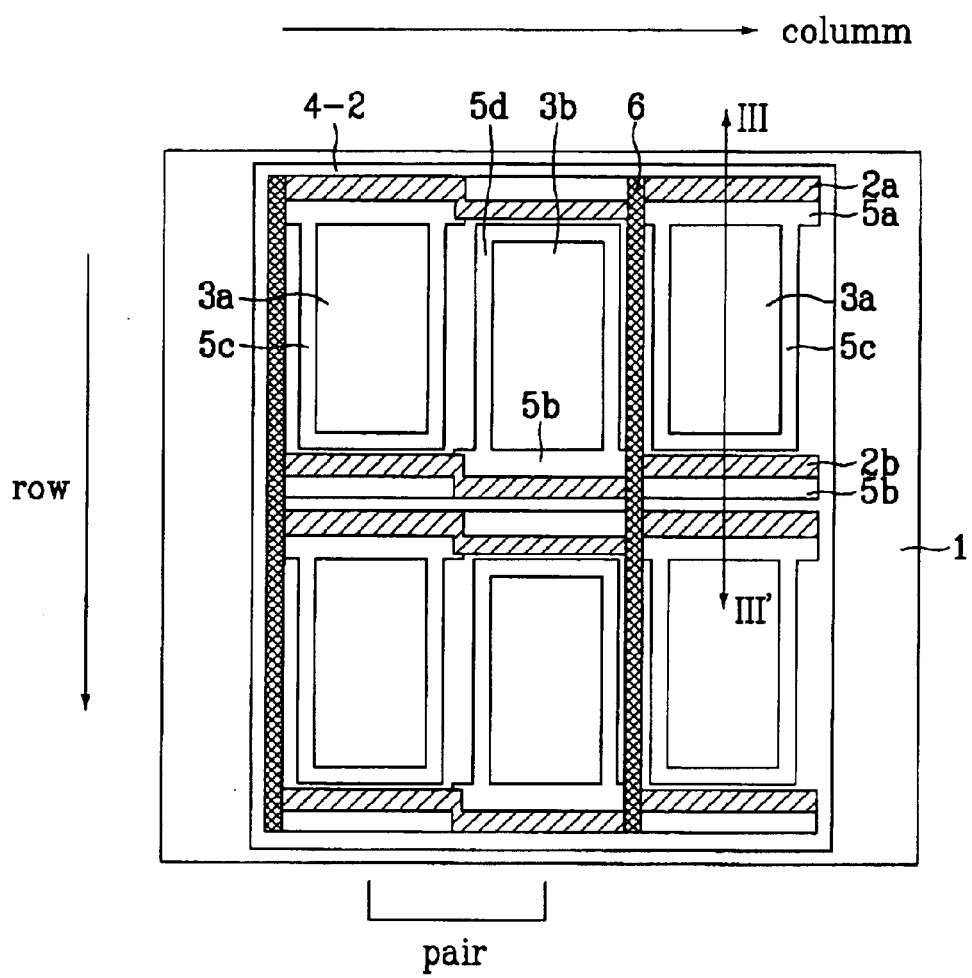
Figure 9A:
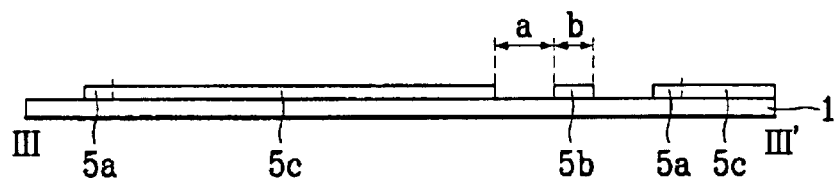
FIGS. 9A to 9C illustrate cross-sectional views of a fabricating process along cutting line III—III' in FIGS. 8A to 8C.
Figure 9B:
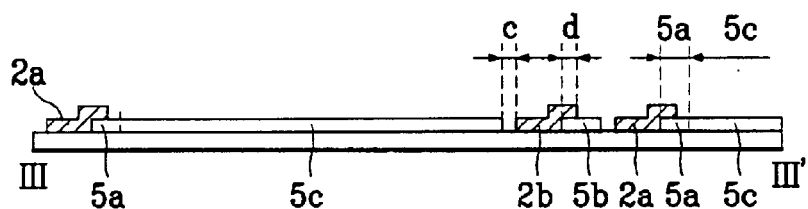
Figure 9C:
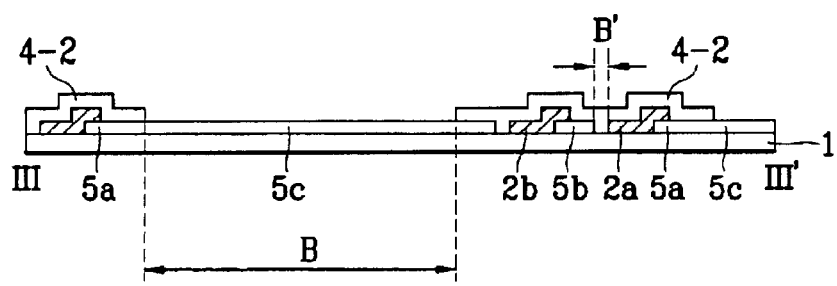

FIGS. 8A to 8C illustrate layouts of a fabricating process of a double-scan type organic EL display panel according to another embodiment of the present invention, and FIGS. 9A to 9C illustrate cross-sectional views of a fabricating process along cutting line III-III' in FIGS. 8A to 8C.

Referring to FIG. 8C, first electrode portions 5a, 5b, 5c, and 5d are formed at each pixel so as to scan-drive simultaneously the pixels constructing a pair with each other in two pixel arrays arranged as a pair in a column, and simultaneously, formed at a connecting portion between pixels with two lines every pixel array so as to connect the corresponding pixels to each other.

And, auxiliary electrodes 2a and 2b are formed on the first electrode portions 5a and 5b formed at the connecting portion between the pixels with two lines every pixel array so as to be overlapped with the first electrode portions 5a and 5b in part.

An organic light-emitting layer(not shown in the drawing) is formed on the first electrode portions 5c and 5d formed at each of the pixels so as to scan-drive simultaneously the pixels constructing the pair with each other. And, a second electrode(not shown in the drawing) is formed on the organic light-emitting layer so as to cross with the first electrode portions 5a, 5b, 5c, and 5d.

The first electrode portions 5a and 5b formed at the connecting portion between the pixels with two lines every pixel array are like prominence and depression.

In this case, when the first electrode portions are divided in a width direction(horizontal), if the first electrode portions 5a and 5b to be formed at the connecting portion between the pixels are formed to have a stripe pattern, areas of the rest first electrode portions 5c and 5d formed at each of the pixels for isolation of the pixel pairs adjacent to each other are reduced so as to decrease opening ratios of the pixels 3a and 3b. Yet, the first electrode portions 5a and 5b formed at the connecting portion between the pixels with two lines every pixel array are formed like prominence and depression in the present invention, thereby enabling to increase the areas of the rest first electrode portions 5c and 5d formed at each of the pixels for isolation of the pixel pairs adjacent to each other.

Moreover, the auxiliary electrodes 2a and 2b are formed like prominence and depression having counter-patterns of the first electrode portions 5a and 5b formed at the connecting portion between the pixels with two lines every pixel array, and specifically, alternate with the first electrode portions so as to be overlapped with the first electrode portions 5a and 5b. Hence, an area that a second insulating layer 4-2 covering the pixels is reduced so as to make an opening ratio have a gain.

And, a second insulating layer 4-2 is formed on the transparent substrate 1 so as to cover an edge of the first electrode 5.

A barrier rib 6 is formed on each of the pixel arrays arranged in one direction. And, the barrier rib 6 isolates a second electrode(not shown in the drawing) electrically by unit of a pixel array pair so as to drive-scan simultaneously two pixel arrays constructing a pair.

As mentioned in the above description, the present invention forms the first electrode every pixel array arranged in one direction with two lines. Yet, the present invention enables to form the first electrode with at least two lines every pixel array.

A method of fabricating the above-constituted organic EL display panel is explained as follows.

Referring to FIG. 8A and FIG. 9A, a first electrode including electrode portions 5a, 5b, 5c, and 5d is formed on a transparent substrate 1. More specifically, the electrode portions 5a and 5b are formed to make a connecting portion between pixels 3a and 3b forming a pair have prominence and depression so as to connect the pixels 3a and 3b forming the pair with each other in two pixel arrays arranged to construct a column pair. And, the rest first electrode portions 5c and 5d are formed at each pixel so as to scan-drive simultaneously the pixels 3a and 3b constructing the pair in two pixel arrays arranged as the column pair.

The first electrode is formed by patterning a transparent conductive material so that the first electrode portions 5a and 5b formed with two lines control odd and even pixels 3a and 3b in a column direction.

An interval a between patterns of the first electrode and a width b of a first electrode pattern depend on process conditions and device characteristics, whereby there are minimum values, which range about 10 μm in general, of the interval and width.

Referring to FIG. 8B and FIG. 9B, auxiliary electrodes 2a and 2b are formed on the first electrode portions 5a and 5b having the prominence-depression connecting portion between the pixels 3a and 3b constructing the pair in the two pixel arrays arranged as the column pair.

In this case, considering electric resistance, a pattern width of each of the auxiliary electrodes 2a and 2b is formed 1~100 μm wide. And, the auxiliary electrodes 2a and 2b are formed to alternate with each other so as to have a predetermined interval c from a pattern of the first electrode portion 5c formed in the pixel as well as generate a partially overlapped portion d with the first electrode portions 5a and 5b having the prominence-depression connecting portion between the pixels 3a and 3b.

The interval "c" and partially-overlapped portion "d" depend on an alignment tolerance of an equipment, and lie between 1~2 μm so as to greatly smaller than the interval a between the patterns of the first electrode portions and the width b of the first electrode portion.

Referring to FIG. 8C and FIG. 9C, a second insulating layer 4-2 is formed over the transparent substrate 1 so as to cover an edge of the first electrode 5.

Figure 10:
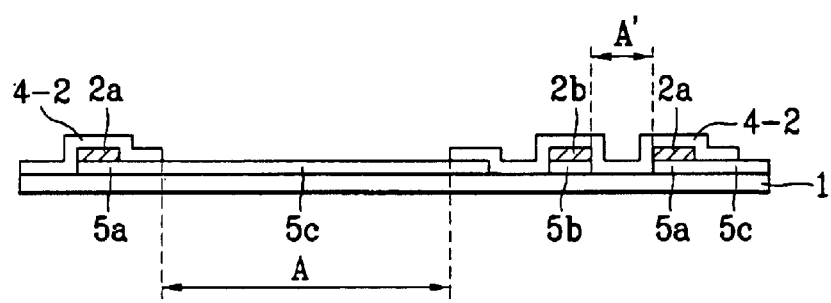
FIG. 10 illustrates a cross-sectional view of a double-scan type organic EL display panel in a fabrication process according to a related art.

FIG. 10 illustrates a cross-sectional view of a double-scan type organic EL display panel in a fabrication process according to a related art, in which it can be seen that an opening ratio of a pixel is much smaller than that in FIG. 9C according to the present invention.

In the related art shown in FIG. 10, auxiliary electrodes 2a and 2b are formed on the patterns of first electrode portions 5a and 5b. Yet, in the present invention shown in FIG. 9C, the auxiliary electrodes 2a and 2b are formed to alternate with the patterns of the first electrode portions 5a and 5b.

The present invention forms the auxiliary electrodes 2a and 2b to alternate with the patterns of the first electrode portions, thereby enabling to reduce the area of the second insulating layer 4-2 covering the pixel. Therefore, the present invention enables to have a gain of an opening ratio as much as the portion that the second insulating layer deviates.

Figure 11A:
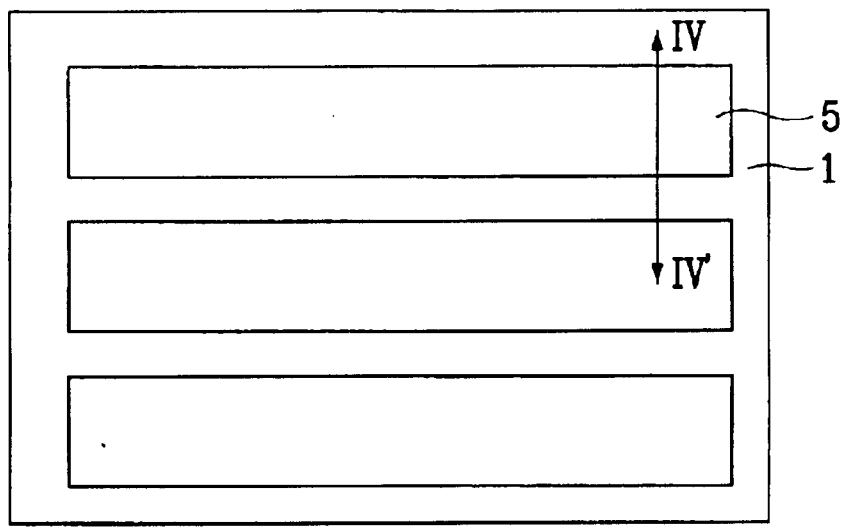
FIG. 11A to FIG. 11B illustrate layouts of a fabricating process of a double-scan type organic EL display panel according to the present invention.
Figure 11B:
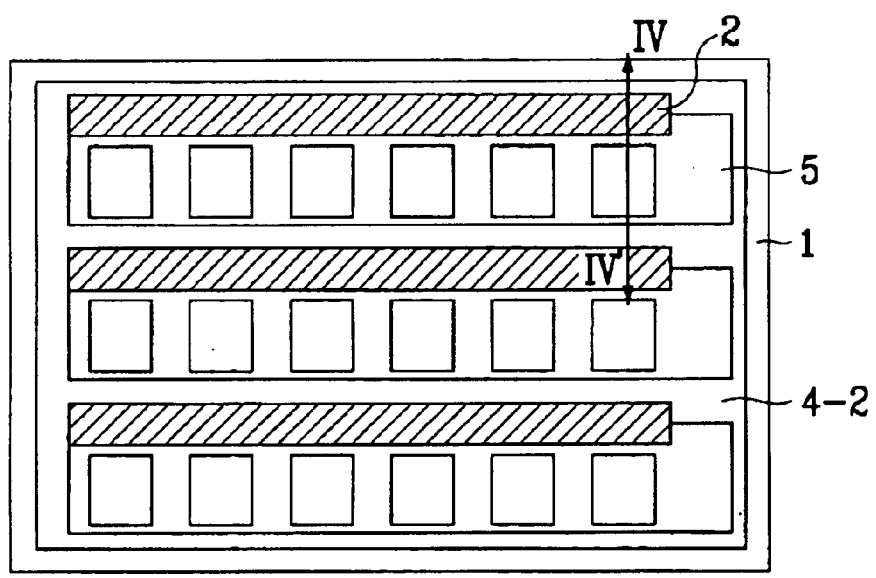
Figure 12A:
FIGS. 12A to 12C illustrate cross-sectional views of a fabricating process along cutting line IV—IV' in FIG. 11A to FIG. 11B.
Figure 12B:
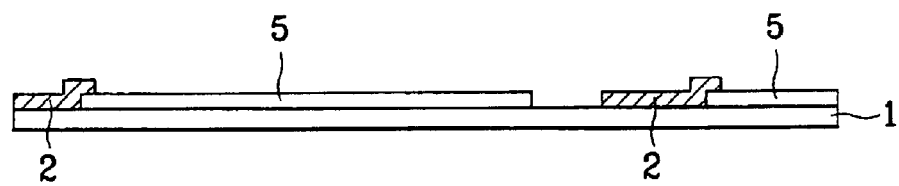
Figure 12C:
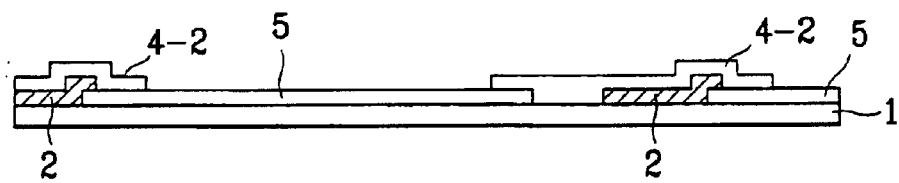

FIG. 11A to FIG. 11B illustrate layouts of a fabricating process of a double-scan type organic EL display panel according to the present invention, and FIGS. 12A to 12C illustrate cross-sectional views of a fabricating process along cutting line IV—IV' in FIG. 11A to FIG. 11B.

Referring to FIG. 11B, an organic EL display panel according to the present invention includes a plurality of pixels at intersections between first electrode 5 and second electrodes (not shown in the drawing).

The first electrodes 5 are formed on a transparent substrate 1 plurally.

An auxiliary electrode 2 is formed on the transparent substrate 1 to be overlapped with each of the first electrodes 5 in part so as to be connected to the corresponding first electrode 5.

An organic light-emitting layer (not shown in the drawing) is formed on the first electrode 5 at each of the pixels so as to scan-drive simultaneously pixels constructing a pair. A second electrode (not shown in the drawing) is then formed on the organic light-emitting layer so as to cross with the first electrodes 5.

And, an insulating layer 4-2 is formed over the transparent substrate so as to cover edges of the first electrodes 5.

A barrier rib 6 is formed at each pixel array arranged in one direction, and isolates the second electrode(not shown in the drawing) electrically by unit of a pixel array pair so as to scan0drive simultaneously two pixel arrays constructing a pair.

The present invention forms the auxiliary electrode 2 to be overlapped with a pattern of the first electrode 1 in part so as to reduce an area that an insulating layer 4-2 covers the pixels, thereby enabling to have a gain of an opening ratio.

The auxiliary electrode is formed of an electrically conductive material such as Cr, Mo, Al, Cu, alloy thereof, or at least two species of Cr, Mo, Al, and Cu. The auxiliary electrode is 0.01~10 μm thick, and a line width depends on a corresponding device.

The insulating can be one of inorganic and organic insulating layers. And, the inorganic insulating layer includes one of oxide-based insulating layers ($SiO_x$) and nitride-based insulating layers ($SiN_x$).

The organic insulating layer is formed of a polymer-based material such as polyacryl-, polyimidie-, novolac-, polyphenyl-, polystyrene-, or the like. The insulating layer is 0.01~10 μm thick and is preferably formed of a material having a low absorbance of visible rays.

Moreover, the first electrode in a light-emitting area should be covered with the insulating layer in part. Namely, the insulating layer is formed to cover an edge of the first electrode vulnerable to a process so as to prevent an electric short-circuit between the first and second electrodes.

Finally, the first and second electrodes are transparent and metal electrodes, respectively.

Accordingly, the organic EL(electroluminescence) display panel and fabrication method thereof according to the present invention have the following advantages or effects.

First of all, the pattern of the first electrode as the transparent electrode is formed previously to increase the pixel area, thereby improving an opening ratio.

Secondly, the auxiliary electrode is formed to alternate but be overlapped with the pattern of the first electrode with a predetermined area so as to increase the pixel area as much as the overlapped area. Therefore, the present invention improves an opening ratio of the organic EL device.

Thirdly, the auxiliary electrode is formed to alternate with the first electrode pattern so as to reduce an area that the second insulating layer covers the pixels. Therefore, the present invention enables to have a gain in an opening ratio amounting to the deviation of the second insulating layer.

Finally, the present invention requires no additional step of forming an insulating layer for increasing an opening ratio, thereby saving a product cost for the fabrication of the organic EL device as well as being advantageous in fabrication efficiency.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. In a double-scan-structured organic electroluminescence (EL) device having a plurality of pixels formed at intersections between electrodes crossing with each other, an organic EL display panel comprising:
    a transparent substrate;
    at least two first electrodes formed on the transparent substrate, wherein some of said first electrodes are formed in odd numbered pixels and the rest of said first electrodes are formed in even numbered pixels;
    a zigzag shape auxiliary electrode formed on said first electrodes, wherein said first electrodes in said odd numbered pixels crisscross with the rest of said first electrodes in said even numbered pixels;
    an organic light-emitting layer formed on the first electrode at the pixel; and
    a second electrode formed on the organic light-emitting layer so as to cross with the first electrode; and
    a barrier rib isolating the second electrode.

2. The organic EL display panel of claim 1, wherein the first electrodes comprise ITO (Indium Tin Oxide).

3. The organic EL display panel of claim 1, wherein the auxiliary electrode comprises at least one of Cr, Mo, Al, Cu or an alloy of one or more thereof.

4. The organic EL display panel of claim 1, wherein the auxiliary electrode comprises at least two layers.

5. The organic El display panel of claim 1, wherein the auxiliary electrode has a line width of about 1 to about 100μm.

6. The organic EL display panel of claim 1, wherein the auxiliary electrode is about 0.01 to about 10μm thick.

7. The organic EL display panel of claim 1, wherein an insulating film is formed on the auxiliary electrode.

8. The organic EL display panel of claim 7, wherein said insulating film does not overlap a light emitting area of a first electrode.

9. An organic electroluminescence (EL) display panel, comprising:
    a substrate;
    a first electrode on said substrate, wherein a connecting portion of said first electrode is configured in a zigzag pattern; and
    a pair of auxiliary electrodes configured in a zigzag pattern on said substrate, wherein a first auxiliary electrode of said pair of auxiliary electrodes is in contact with said first electrode, and a second auxiliary electrode of said pair of auxiliary electrodes is not in contact with said first electrode.

10. The organic EL display panel of claim 9, wherein said pair of auxiliary electrodes are in contact with said substrate and an insulating layer.

11. The organic EL display panel of claim 10, wherein said insulating layer is continuously formed in contact with both of said pair of auxiliary electrodes.

12. The organic EL display panel of claim 9, wherein said first auxiliary electrode is configured in a zigzag pattern that is complementary to said connecting portion such that said first auxiliary electrode contacts said connecting portion at intersecting points.

13. A display panel comprising:
    a substrate;
    a pair of auxiliary electrodes on said substrate;
    barriers on said substrate formed in a longitudinal direction; and
    first electrodes, which have a length greater than a width, adjacent to said pair of auxiliary electrodes, wherein said first electrodes comprise first length portions perpendicular to said barriers, wherein at least one of said first length portions does not line up in the direction perpendicular to said barriers with at least one other of said first length portions.

14. The display panel of claim 13, wherein each of said pair of auxiliary electrodes has a jog in its length parallel to said barriers.

15. The display panel of claim 13, wherein said pair of auxiliary electrodes comprise first portions, second portions and third portions, wherein said first and third portions are parallel to one another and said second portions are perpendicular to and between said first and third portions.

16. The display panel of claim 15, wherein said first and third portions are off set by said second portions.

17. The display panel of claim 16, wherein said second portions have a length greater than a width, wherein said length of said second portions is parallel to a length of said barriers.

18. The display panel of claim 15, wherein a height of said second portions is parallel to a height of said barriers.

19. The display panel of claim 15, wherein at least one portion of said auxiliary electrodes overlaps said first electrodes.

20. The display panel of claim 15, wherein said first and third portions do not line up linearly.

* * * * *